United States Patent [19]

Jang et al.

[11] Patent Number: 5,536,681
[45] Date of Patent: Jul. 16, 1996

[54] PE-OX/OZONE-TEOS GAP FILLING CAPABILITY BY SELECTIVE $N_2$ TREATMENT ON PE-OX

[75] Inventors: Syun-Ming Jang, Hsinchu; Lu-Min Liu, Hsinchu Hsien, both of Taiwan

[73] Assignee: Taiwan Semiconductor Manufacturing Company, Hsinchu, Taiwan

[21] Appl. No.: 494,638

[22] Filed: Jun. 23, 1995

(Under 37 CFR 1.47)

[51] Int. Cl.⁶ .............................. H01L 21/44; H01L 21/48
[52] U.S. Cl. ........................ 437/195; 437/238; 437/235; 437/194; 437/173; 437/978
[58] Field of Search ...................................... 437/238, 195, 437/194, 235, 173, 978

[56] References Cited

U.S. PATENT DOCUMENTS

| | | | |
|---|---|---|---|
| 5,413,963 | 5/1995 | Yen et al. | 437/978 |
| 5,484,749 | 1/1996 | Maeda et al. | 437/238 |
| 5,489,553 | 2/1996 | Chen | 437/195 |

FOREIGN PATENT DOCUMENTS 0291415  11/1993  Japan .

*Primary Examiner*—Trung Dang
*Attorney, Agent, or Firm*—George O. Saile; Rosemary L. S. Pike

[57] ABSTRACT

An improved method of gap filling in the dielectric layer by performing selective $N_2$ treatment on the PE-OX underlayer is described. Semiconductor device structures are provided in and on a semiconductor substrate. A conducting layer is deposited overlying the top surfaces of the semiconductor device structures and patterned to form conducting lines. A first silane-based oxide layer is deposited over the surfaces of the conducting layer wherein a gap is formed between portions of the patterned conducting layer. The first oxide layer is covered with a layer of photoresist which is patterned so that the portions of the first oxide layer overlying the conducting lines are not covered by the photoresist layer. The portions of the first oxide layer not covered by the photoresist layer are treated with $N_2$ plasma. The photoresist layer is removed. A second $O_3$-TEOS oxide layer is deposited over the first oxide layer wherein the gap is filled by the second oxide layer and fabrication of the integrated circuit is completed.

21 Claims, 2 Drawing Sheets

PE-OX/OZONE-TEOS GAP FILLING CAPABILITY BY SELECTIVE N$_2$ TREATMENT ON PE-OX

RELATED PATENT APPLICATION

Co-pending U.S. patent application Ser. No. 08/494,630, (TS94-098) filed on Jun. 23, 1995, to S. M. Jang et al.

BACKGROUND OF THE INVENTION

1. Field of the Invention

The present invention relates to the fabrication of integrated circuit devices, and more particularly, to a method of improving the gap filling characteristics of an ozone-TEOS dielectric layer in the fabrication of integrated circuits.

2. Description of the Prior Art

Ozone-tetraethoxysilane (O$_3$-TEOS) is often used as a dielectric layer overlying a patterned metal layer. Since, O$_3$-TEOS is moisture absorptive, a dense and good quality plasma-enhanced chemically vapor deposited (PECVD) oxide (PE-OX) is usually deposited prior to O$_3$-TEOS deposition to prevent moisture penetration into the underlying devices. The underlayer also provides a uniform nucleation layer, reduces poisoned via problems, inhibits cracking, and suppresses hillock formation. However, because of the poor step coverage of PE-OX, voids form within the overlying O$_3$-TEOS layer within narrow gaps between features on the semiconductor substrate surface.

Related patent application Ser. No. 08/494,630, (TS94-098) to the same inventors improves the gap-filling capability of ozone-TEOS by using an underlayer composed of both PE-OX and PE-TEOS.

SUMMARY OF THE INVENTION

Accordingly, it is a primary object of the invention to provide a process for improving the gap filling characteristics of the dielectric layer in the fabrication of integrated circuits.

It is a further object of the invention to provide a process for improving the step coverage of ozone-TEOS.

It is yet another object to provide a process for improving the step coverage of ozone-TEOS by treating the PE-OX underlayer.

In accordance with the objects of the invention, an improved method of gap filling in the dielectric layer by performing selective N$_2$ treatment on the PE-OX underlayer is achieved. Semiconductor device structures are provided in and on a semiconductor substrate. A conducting layer is deposited overlying the top surfaces of the semiconductor device structures and patterned to form conducting lines. A first silane-based oxide layer is deposited over the surfaces of the conducting layer wherein a gap is formed between portions of the patterned conducting layer. The first oxide layer is covered with a layer of photoresist which is patterned so that the portions of the first oxide layer overlying the conducting lines are not covered by the photoresist layer. The portions of the first oxide layer not covered by the photoresist layer are treated with N$_2$ plasma. The photoresist layer is removed. A second O$_3$-TEOS oxide layer is deposited over the first oxide layer wherein the gap is filled by the second oxide layer and fabrication of the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
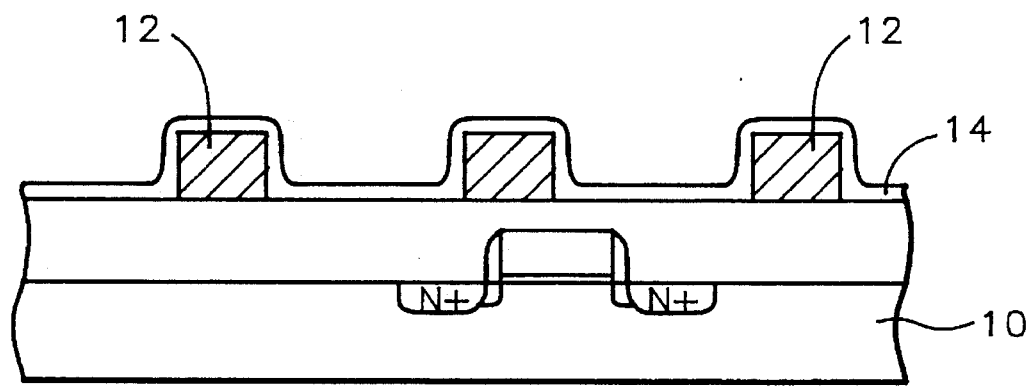
FIG. 1 is a cross-sectional representation of a preferred embodiment of the present invention.

Referring now more particularly to FIG. 1, there is shown a semiconductor substrate 10, in which may be formed semiconductor device structures which may include polysilicon gate electrodes and source and drain regions. A layer of conducting material 12 has been deposited over the surface of the semiconductor substrate and patterned. The surface of the substrate may be planarized, as shown, or not. The conducting material may be metal, such as Ti/TiN/AlCu(Si)/TiN, or Ti/TiN/Ti/AlCu(Si)/TiN, or the like.

A layer of plasma-enhanced silane oxide SiH$_4$ 14 is deposited by plasma enhanced chemical vapor deposition (PECVD) over the surface of the patterned conducting layer, according to a standard recipe. This layer will be referred to henceforth as the PE-OX underlayer. The PE-OX underlayer is deposited to a thickness of between about 1000 to 2000 Angstroms. The sidewall step coverage of the PE-OX is between about 0.33 to 0.47. The bottom step coverage is between about 0.53 to 0.67. Other PE-oxides such as PE-TEOS have better step coverage, but PE-SiH$_4$ provides better hot carrier lifetimes and hence, results in higher quality devices.

Figure 2:
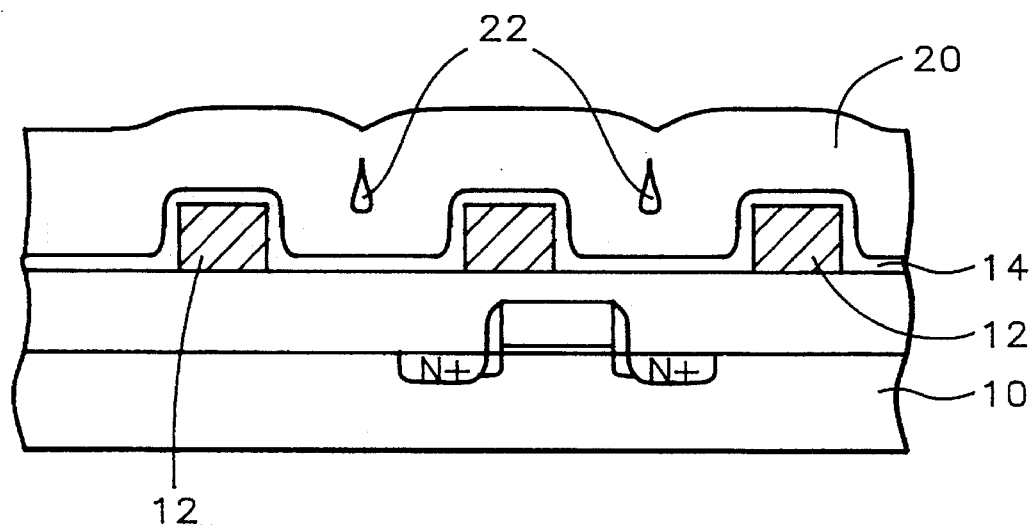
FIG. 2 is a cross-sectional representation of a process of the prior art.

FIG. 2 illustrates the deposition of O$_3$-TEOS 20 overlying the PE-OX underlayer, as in the prior art. Voids 22 form within the O$_3$-TEOS layer because of poor step coverage of the O$_3$-TEOS on the PE-OX. The sidewall step coverage of the O$_3$-TEOS layer is about 0.67 and the bottom step coverage is about 0.83.

Figure 3:
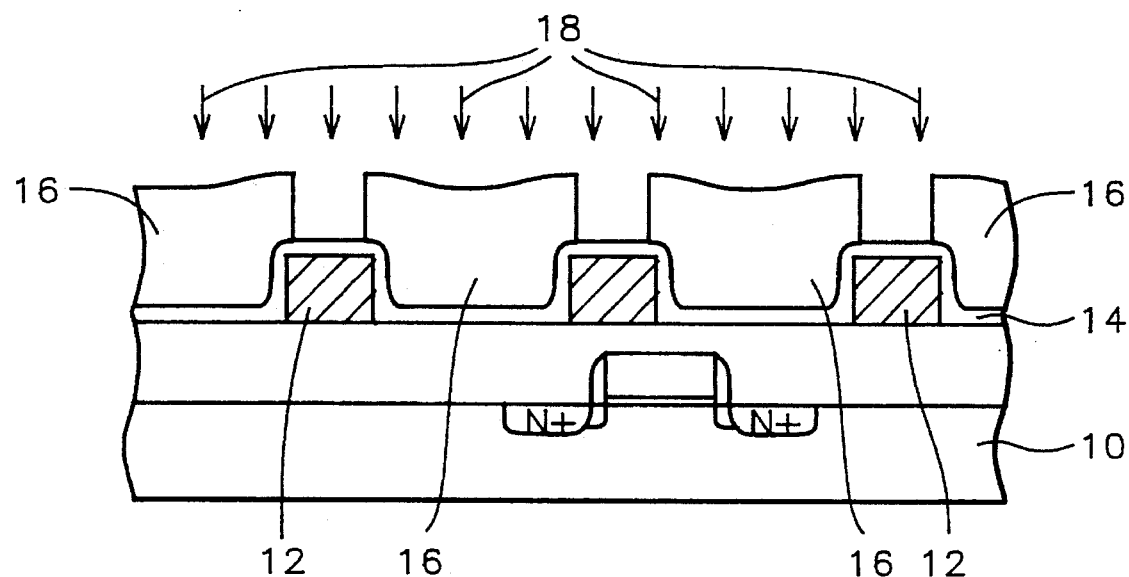
FIGS. 3 and 4 are cross-sectional representations of a preferred embodiment of the present invention.

Referring now to FIG. 3, the selective N$_2$ treatment of the present invention will be described. Before the O$_3$-TEOS layer is deposited, the PE-OX underlayer will be treated with N$_2$ to improve the step coverage of the subsequent O$_3$-TEOS deposition. A layer of photoresist is coated over the surface of the semiconductor substrate. Using a reverse tone of the conducting layer mask, the photoresist layer is patterned to provide a photoresist mask 16 covering the PE-OX layer except where the PE-OX layer overlies the patterned conducting layer. Next, the semiconductor substrate is subjected to a N$_2$ plasma treatment. N$_2$ plasma is flowed at between about 400 to 600 sccm at a pressure of between about 1 to 5 Torr for between about 25 to 50 seconds.

We have found that the deposition rate of ozone-TEOS on N$_2$-treated PE-OX is lower than on untreated PE-OX. In experiments, the deposition rates of ozone-TEOS on treated and untreated PE-OX were compared. On untreated PE-OX the deposition rate of ozone-TEOS was more than 1750 Angstroms per minute. On treated PE-OX, the deposition rate dropped to below 1620 Angstroms per minute. The optimal treatment time is approximately 25 seconds because the treated and untreated areas have the greatest difference in deposition rate, 1610 versus 1760 Angstroms/minute, at 25 seconds. This is a decrease in deposition rate of 10% for the selective N$_2$ treatment process.

The $O_3$-TEOS wet etch rate was measured for various $N_2$ treatment times on the PE-OX underlayer. It was seen that the selective $N_2$ treatment of the present invention does not affect the wet etch rate. Hence, the quality of the $O_3$-TEOS layer is unaffected by the selective $N_2$ treatment of the underlayer.

Since only the PE-OX layer overlying the conducting lines is treated with $N_2$, the ozone-TEOS will deposit at a lower deposition rate on top of the conducting lines than on the sidewalls and between the lines, thus improving the sidewall and bottom step coverage by approximately 10%. The sidewall step coverage of the $O_3$-TEOS layer will be about 0.74 and the bottom step coverage will be about 0.91 after the PE-OX selective $N_2$ treatment.

Figure 4:
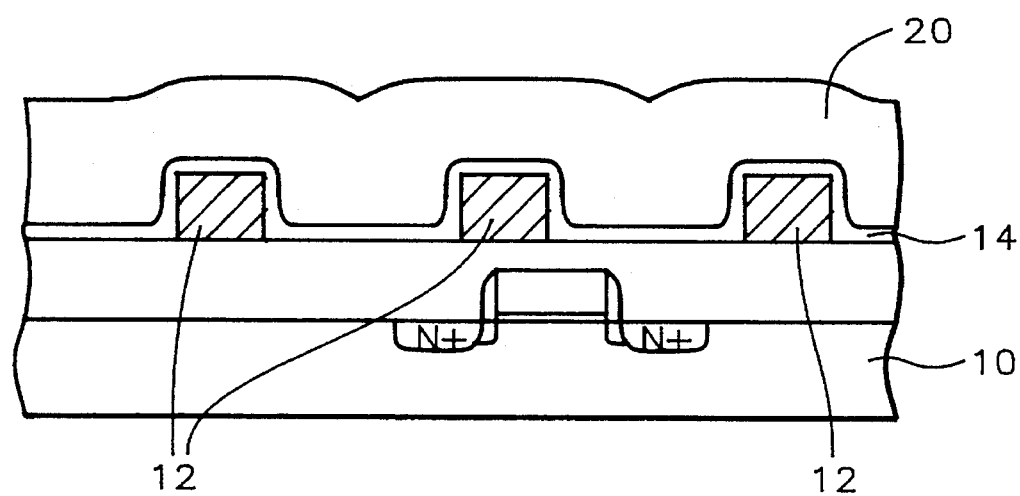

Referring now to FIG. 4, the photoresist mask is removed and an ozone-TEOS layer 20 is deposited overlying the PE-OX layer by subatmospheric chemical vapor deposition to a thickness of between about 4000 to 6000 Angstroms. No voids are formed within the layer 20 because of the improved sidewall and bottom step coverage.

The process of the invention results in improved gap filling of ozone-TEOS and improved planarity of the resulting silicon oxide dielectric layer 14/20. Device performance is enhanced by using PE-SiH$_4$ as the underlayer because of its high quality. The selective $N_2$ treatment of the invention provides for improved gap filling of the $O_3$-TEOS layer.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit comprising:

providing semiconductor device structures in and on a semiconductor substrate;

depositing a conducting layer overlying the surfaces of said semiconductor device structures and patterning said conducting layer to form conducting lines wherein a gap is formed between said conducting lines;

depositing a silane-based oxide layer over the surfaces of said conducting lines wherein said gap remains between said conducting lines;

covering said silane-based oxide layer with a layer of photoresist and patterning said photoresist layer so that the portions of said silane-based oxide layer overlying said conducting lines are not covered by said photoresist layer;

treating said portions of said silane-based oxide layer not covered by said photoresist layer with $N_2$ plasma;

removing said photoresist layer;

depositing a second oxide layer over said silane-based oxide layer wherein said gap is filled by said second oxide layer; and completing the fabrication of said integrated circuit.

2. A method according to claim 1 wherein said silane-based oxide layer comprises plasma enhanced chemically vapor deposited SiH$_4$ oxide.

3. A method according to claim 1 wherein said photoresist layer is patterned using a reverse tone conducting layer mask.

4. A method according to claim 1 wherein said treating said portions of said silane-based oxide layer with $N_2$ plasma comprises flowing $N_2$ plasma at a rate of between about 400 to 600 sccm under a pressure of between about 1 to 5 Torr for a duration of between about 25 to 50 seconds.

5. A method according to claim 1 wherein said second oxide layer comprises subatmospheric chemically vapor deposited ozone-TEOS.

6. A method according to claim 1 wherein the deposition rate of said second oxide layer is lower over said portions of said silane-based oxide layer treated with $N_2$ plasma than the deposition rate over portions of said silane-based oxide layer not treated with $N_2$ plasma.

7. A method according to claim 6 wherein said lower deposition rate over portions of said silane-based oxide layer overlying said conducting lines results in a better sidewall and bottom stepcoverage of said second oxide layer.

8. A method according to claim 7 wherein said stepcoverage of said second oxide layer is improved by about 10%.

9. A method of manufacturing an integrated circuit comprising:

providing semiconductor device structures in and on a semiconductor substrate;

depositing a conducting layer overlying the surfaces of said semiconductor device structures and patterning said conducting layer to form conducting lines wherein a gap is formed between said conducting lines;

depositing a silane-based oxide layer over the surfaces of said conducting lines wherein said gap remains between said conducting lines;

covering said silane-based oxide layer with a layer of photoresist and patterning said photoresist layer so that the portions of said silane-based oxide layer overlying said conducting lines are not covered by said photoresist layer;

treating said portions of said silane-based oxide layer not covered by said photoresist layer with $N_2$ plasma flowed at a rate of between about 400 to 600 sccm under a pressure of between about 1 to 5 Torr for a duration of between about 25 to 50 seconds;

removing said photoresist layer;

depositing a second oxide layer over said silane-based oxide layer wherein said gap is filled by said second oxide layer; and completing the fabrication of said integrated circuit.

10. A method according to claim 9 wherein said silane-based oxide layer comprises plasma enhanced chemically vapor deposited SiH$_4$ oxide.

11. A method according to claim 9 wherein said photoresist layer is patterned using a reverse tone conducting layer mask.

12. A method according to claim 9 wherein said second oxide layer comprises subatmospheric chemically vapor deposited ozone-TEOS.

13. A method according to claim 9 wherein the deposition rate of said second oxide layer is lower over said portions of said silane-based oxide layer treated with $N_2$ plasma than the deposition rate over portions of said silane-based oxide layer not treated with $N_2$ plasma.

14. A method according to claim 13 wherein said lower deposition rate over portions of said silane-based oxide layer overlying said conducting lines results in a better sidewall and bottom stepcoverage of said second oxide layer.

15. A method according to claim 14 wherein said stepcoverage of said second oxide layer is improved by about 10%.

16. A method of forming a dielectric layer over conducting lines in the fabrication of an integrated circuit comprising:

providing semiconductor device structures in and on a semiconductor substrate;

providing conducting lines overlying said semiconductor device structures wherein a gap is formed between said conducting lines;

depositing a silane-based oxide layer over the surfaces of said conducting lines wherein said gap remains between said conducting lines;

covering said silane-based oxide layer with a layer of photoresist and patterning said photoresist layer so that the portions of said silane-based oxide layer overlying said conducting lines are not covered by said photoresist layer;

treating said portions of said silane-based oxide layer not covered by said photoresist layer with $N_2$ plasma;

removing said photoresist layer; and depositing an ozone-TEOS layer over said silane-based oxide layer wherein said gap is filled by said ozone-TEOS layer completing the formation of said dielectric layer over conducting lines in the fabrication of an integrated circuit.

17. A method according to claim 16 wherein said silane-based oxide layer comprises plasma enhanced chemically vapor deposited $SiH_4$ oxide.

18. A method according to claim 16 wherein said photoresist layer is patterned using a reverse tone conducting layer mask.

19. A method according to claim 16 wherein said treating said portions of said silane-based oxide layer with $N_2$ plasma comprises flowing $N_2$ plasma at a rate of between about 400 to 600 sccm under a pressure of between about 1 to 5 Torr for a duration of between about 25 to 50 seconds.

20. A method according to claim 16 wherein the deposition rate of said ozone-TEOS layer is lower over said portions of silane-based oxide layer treated with $N_2$ plasma than the deposition rate over portions of said silane-based oxide layer not treated with $N_2$ plasma.

21. A method according to claim 20 wherein said lower deposition rate over portions of said silane-based oxide layer overlying said conducting lines results in a 10% better sidewall and bottom stepcoverage of said ozone-TEOS layer.

* * * * *